United States Patent [19]

Asmar

[11] Patent Number: 4,953,933

[45] Date of Patent: Sep. 4, 1990

[54] OPTICAL ENCODER READING DEVICE

[75] Inventor: Romeal F. Asmar, Bellevue, Wash.

[73] Assignee: The Boeing Company, Seattle, Wash.

[21] Appl. No.: 377,723

[22] Filed: Jul. 10, 1989

[51] Int. Cl.$^5$ .......................... G02B 6.26; G02B 6.30; G01D 5/34; G06K 7/10
[52] U.S. Cl. ............................. 350/96.15; 350/96.11; 350/96.12; 350/96.16; 350/96.17; 350/96.20; 350/96.31; 350/96.34; 370/1; 370/4; 341/14; 250/570; 250/231.18
[58] Field of Search ............... 350/96.10, 96.11, 96.12, 350/96.15, 96.16, 96.17, 96.20, 96.22, 96.24, 96.31, 96.34; 370/1, 2, 3, 4; 341/13, 14, 137; 437/20, 21, 22; 250/570, 271, 231.18

[56] References Cited

U.S. PATENT DOCUMENTS

| | | | |
|---|---|---|---|
| 3,622,793 | 11/1971 | Dalton et al. | 250/570 X |
| 3,663,194 | 5/1972 | Greenstein et al. | 65/43 |
| 4,079,404 | 3/1978 | Comerford et al. | 357/19 |
| 4,112,170 | 9/1978 | Rauscher | 428/212 |
| 4,291,976 | 9/1981 | McMahon | 356/150 |
| 4,356,395 | 10/1982 | Miller | 250/231.18 X |
| 4,362,357 | 12/1982 | Stockmann et al. | 350/96.16 |
| 4,384,038 | 5/1983 | Khoe et al. | 430/321 |
| 4,474,425 | 10/1984 | Kaede | 350/96.16 |
| 4,515,428 | 5/1985 | Findakly | 350/96.12 |
| 4,535,440 | 8/1985 | Mannschke | 370/1 |
| 4,578,791 | 3/1986 | Chen | 372/50 |
| 4,604,725 | 8/1986 | Davies et al. | 250/231.18 X |
| 4,630,883 | 12/1986 | Taylor et al. | 350/96.15 |
| 4,647,147 | 3/1987 | Pikulski et al. | 350/96.17 |
| 4,653,845 | 3/1987 | Tremblay et al. | 350/96.16 |
| 4,669,815 | 6/1987 | Thaniyavarn | 350/96.15 |
| 4,674,827 | 6/1987 | Izutsu et al. | 350/96.12 |
| 4,693,544 | 9/1987 | Yamasaki et al. | 350/96.16 |
| 4,693,546 | 9/1987 | Lorenzo et al. | 350/96.13 |
| 4,739,163 | 4/1988 | Gambs et al. | 250/231.18 |
| 4,740,691 | 4/1988 | Ushiyama | 250/231.18 |
| 4,887,255 | 12/1989 | Handa et al. | 350/96.12 |
| 4,897,671 | 1/1990 | Mahapatra et al. | 350/96.12 X |

FOREIGN PATENT DOCUMENTS

| | | | |
|---|---|---|---|
| 0118185 | 9/1984 | European Pat. Off. | 350/96.17 X |
| 1407544 | 9/1975 | United Kingdom | 350/96.15 X |
| 2054995 | 2/1981 | United Kingdom | 341/14 X |
| 2125184 | 2/1984 | United Kingdom | 370/1 X |

OTHER PUBLICATIONS

"Electronic Letters," Aug. 5, 1976, vol. 12, No. 16, pp. 404–406.

Lagu et al., "Silver Ion-Exchanged, Buried, Glass Optical Waveguides with Symmetric Index Profile," *App. Phys. Lett.*, vol. 48(1), Jan. 6, 1986, pp. 19–20.

Forrest et al., "Channel Waveguides in Glass via Silver-Sodium Field-Assisted Ion Exchange," *Journal of Lightwave Technology*, vol. LT-4, No. 2, Feb. 1986, pp. 140–150.

Murphy "Fiber Optic Trends," *Photonics Spectra*, Nov. 1987, pp. 101–106.

*Primary Examiner*—Brian Healy
*Attorney, Agent, or Firm*—Christensen, O'Connor, Johnson & Kindness

[57] ABSTRACT

Disclosed is an optical sensor readhead (10) which includes a glass substrate (14) that contains buried ion diffused optical transmission channels (12) for supplying light to and receiving reflected light from optical encoder bands (22) of an optical encoder (20). In the disclosed arrangements, each optical transmission channel (12) is associated with a specific optical encoder band (22) and includes fourteen spaced apart optical waveguides (36) which are located along one edge (18) of the substrate (14) and which are dimensioned and positioned to supply light to and receive light from the associated optical encoder band (22). Located at the oppositely disposed edge (16) of the substrate (14) are input and output optical waveguides (40, 42, and 44), which couple optical energy into and out of the optical transmission channel (12). Intermediate the optical waveguides (36) and the input and output waveguides (40 and 42) is an optical mixer section (38), which is in optical communication with the optical waveguides (36) and the input and output optical waveguides.

10 Claims, 5 Drawing Sheets

OPTICAL ENCODER READING DEVICE

BACKGROUND OF THE INVENTION

This invention relates to optical position encoders and, more particularly, to arrangements of optical fibers or light guides that function as a readhead for such optical position encoders.

As is known in the art, optical encoders include a plurality of adjacent strip-like bands that are subdivided into regions or segments that exhibit first and second reflection coefficients (e.g., transmissive regions and highly reflective regions). When the optical encoder is illuminated along a linear path that traverses the optical encoder bands, light reflected from each band is detected with the two degrees of reflectivity corresponding to the "0" and "1" binary states. Collectively, the light reflected from the encoder bands thus forms a binary encoded optical signal that is representative of the position of the encoder at the time of illumination.

One type of prior art arrangement for illuminating the bands of an optical encoder and, in addition, receiving the reflected light includes a linear array of optical fibers that are arranged and positioned so that the end regions of the fibers are maintained substantially parallel to one another with the end faces of the fibers being in spaced apart parallel juxtaposition with the surface of the optical encoder. In such an arrangement, which commonly is called a reading head or readhead, each band of the optical encoder is spatially and operably associated with one or more specific optical fibers that direct light onto the surface of the associated encoder band and receive light reflected from the associated encoder band. In some arrangements, the associated optical fibers both transmit light to the surface of the optical encoder and receive reflected light. In other arrangements, separate transmitting and receiving fibers are used.

In operation, a pulse of light is transmitted along those optical fibers that are employed to transmit light to the associated encoder bands. Light, launched from the ends of the optical fibers impinges on the surface of the optical encoder with light that is reflected from each individual band being received either by the transmitting fibers or by dedicated receiving fibers. The reflected light then propagates along the associated receiving fibers for subsequent reception and processing to form a binary encoded optical or electrical signal that is representative of the encoder position relative to the fixed or reference position of the readhead.

For example, a rotary optical encoder for producing an N-bit Gray Code signal representative of the angular position of a shaft or other rotatable object generally is formed as a disk that includes N circumferential bands concentrically surrounding the axis of rotation. Each circumferential band is subdivided into interspersed highly reflective and highly transmissive equal angular radial segments with the two innermost circumferential bands each including a single reflective (and transmissive) segment that is subtended by an angle of $\pi$ radians (180°). In this arrangement, the number of reflective (and transmissive) segments in the N−2 circumferential bands located outwardly of the two innermost bands sequentially increases in accordance with the sequence $2^{i-2}(i=3, 4, \ldots, N)$; where i identifies the circumferential band (as counted from the center of the optical encoder). Thus, each reflective (and transmissive) segment of the outmost N−2 circumferential bands is subtended by an angle of $\pi/2^{i-2}$. In addition, the reflective (and transmissive) regions of the two innermost circumferential bands are positioned relative to one another so that the reflective (and transmissive) segments overlap one another by $\pi/2$ (90°) and each reflective segment of the outermost N−2 circumferential bands overlaps a contiguous reflective segment of the nextmost inner circumferential band by an angle of $\pi/2^{i-1}$. When a suitably configured readhead is mounted at a fixed position that extends radially along the surface of such an encoder disk, an N-bit binary signal is formed by light that is reflected from the encoder bands to uniquely identify the radial position (angle of rotation) of the optical encoder. Since an encoder of the described type provides $2^N$ binary encoded N-bit binary signals, an angular resolution of $\pi/2^{N-1}$ radians is attained.

Although prior art readheads of the above-described configuration perform satisfactorily in many applications, disadvantages and drawbacks are encountered in situations that require optical encoders of relatively small size with an accompanying need for precise determination of angular position (high resolution). In particular, such applications require a relatively large number of small diameter optical fibers which must be mounted in precise relationship both with respect to one another and with respect to the surface of the optical encoder. Because of the small fiber size and positional constraints, small high resolution optical readheads are not well suited to automated large scale fiberoptics manufacturing techniques and are otherwise difficult to fabricate. Thus, in the prior art, such devices have been both costly and, in many cases, not as reliable as desired.

Moreover, when small high resolution optical readheads are fabricated with prior art fabrication techniques using discrete optical fibers, it often is difficult to achieve desired performance specifications. For example, manufacturing tolerances associated with the assembly of individual fibers may not closely align groups of fibers with the associated bands of the optical encoder. When proper alignment is not achieved, light that is launched from the end of the fibers may impinge upon an adjacent band of the optical encoder and/or light that is received by the optical fibers may have been reflected from an adjacent band of the optical encoder. If this occurs, an undesirable amount of "cross-talk" may be encountered (i.e., the optical signals provided to and received from the individual bands of the optical encoder may not be properly isolated from one another). In addition, using prior art discrete fiber fabrication techniques, it may be difficult to obtain low insertion loss and desired efficiency.

SUMMARY OF THE INVENTION

The present invention provides an optical readhead in which optical transmission channels for supplying light to and receiving reflected light from the bands of optical encoder are integrally formed in a planar glass substrate by ion diffusion techniques. Each optical transmission channel is associated with one band of the optical encoder with the optical transmission channels extending to one edge of the planar glass substrate so that at least the terminal regions of the optical transmission channels are substantially parallel to one another and so that the end face of each optical transmission channel is directed toward an associated band of the optical encoder when the optical readhead is mounted in spaced apart juxtaposition with the optical encoder.

In one disclosed embodiment, ten optical transmission channels are diffused (buried) in a planar glass substrate to provide a 10-bit binary encoded optical signal representative of the angular position of an optical encoder having ten concentric circumferentially extending bands that are subdivided into reflective and transmissive segments. In this arrangement, the end region of each of the ten optical transmission channels that is located nearest the optical encoder includes a linear array of 14 spaced-apart ion-diffused optical waveguides which are substantially perpendicular to a first edge of the glass substrate. Each array of waveguides occupies a region of the first edge of the glass substrate that is commensurate with the dimension of an associated encoder band. Spacing between the optical transmission channels is established so that each array of optical waveguides launches light directly toward its associated band of the optical encoder and receives reflected light from that associated band.

Located along a second, oppositely disposed, edge of the glass substrate are spaced-apart ion-diffused waveguides for supplying light to the linear waveguide arrays and receiving reflected light that is collected by the optical waveguide linear arrays. More specifically, each optical transmission channel includes a pair of optical waveguides that are diffused into the region of the glass substrate that is contiguous to the second edge to thereby form input and output optical waveguides which terminate at and are substantially perpendicular to the second edge of the planar glass substrate. Relative to the second substrate edge, the input and output waveguides of each optical transmission path extend toward the linear array of optical waveguides that are located along the first edge of the glass substrate, with the input and output waveguides smoothly merging with one another. Located between the junction of the input and output waveguides and the linear array of optical waveguides is an optical mixer section which is formed in the substrate by ion diffusion at the same time the linear array of waveguides and the input and output waveguides are formed.

In operation, a pulse of light is supplied to the input waveguide of each optical transmission channel with the mixing section serving to uniformly distribute the light for propagation along the 14 optical waveguides. Light that is launched from the end of the 14 optical waveguides impinges on the associated band region of the optical encoder. If the portion of the optical encoder that is positioned adjacent the array of 14 optical waveguides is highly reflective, light that is reflected from the band region of the optical encoder is received by the 14 arrayed optical waveguides and propagates back along the optical waveguides to the mixing section, which combines the light received by the 14 optical waveguides. Passing from the mixing section, the light is split so that approximately one-half of the light energy propagates outwardly through the output optical waveguide with the remaining portion of the light energy propagating outwardly along the input optical waveguide.

In a second disclosed embodiment, two optical transmission channels are used for each optical encoder band with one of the optical transmission channels supplying light energy to the associated optical encoder band and the second optical transmission channel receiving light that is reflected from the associated optical encoder band. The optical transmission channels of this second embodiment differ from the optical transmission channels of the first disclosed embodiment in two respects. First, the terminal region of optical transmission channel that is located at the second edge of the glass substrate forms a single optical waveguide (for input or output of optical energy), rather than forming a pair of input and output optical waveguides. Second, the optical transmission channels that supply light to the optical encoder and the optical transmission channels that receive light reflected from the optical encoder are formed (buried) in separate glass substrates that are mounted closely adjacent one another so that each input optical transmission channel is adjacent (i.e., overlies) an output optical transmission channel.

In the preferred embodiments of the invention, the planar glass substrate is a sodium aluminosilicate glass in which the optical transmission channels are formed by electric field assisted diffusion of thin silver films. In the diffusion process, thin strips of silver configured in accordance with the geometry and dimensions of the optical transmission channels is deposited on one surface of the glass substrate. A copper (or other highly conductive film) is deposited on the opposite surface of the substrate. The substrate is placed in a vacuum chamber with the silver film and the copper film being connected to an electrical source to respectively serve as anode and cathode elements that produce a transverse electric field in the glass substrate. The diffusion process is carried out at an elevated temperature with both the deposited silver anode and a heated source of silver vapoer providing silver ions (Ag+) that diffuse into the glass substrate. As the aluminum ions diffuse inwardly, ion exchange occurs between sodium ions (Na+) of the glass substrate and the silver ions to thereby increase the refractive index of the glass and form the desired optical elements (optical waveguide arrays, input and output waveguides, and the intermediate mixing sections). An appropriate graded refraction index profile is obtained by controlling diffusion time, temperature and electric field so that desired multimode characteristics are achieved.

DETAILED DESCRIPTION

Figure 1:
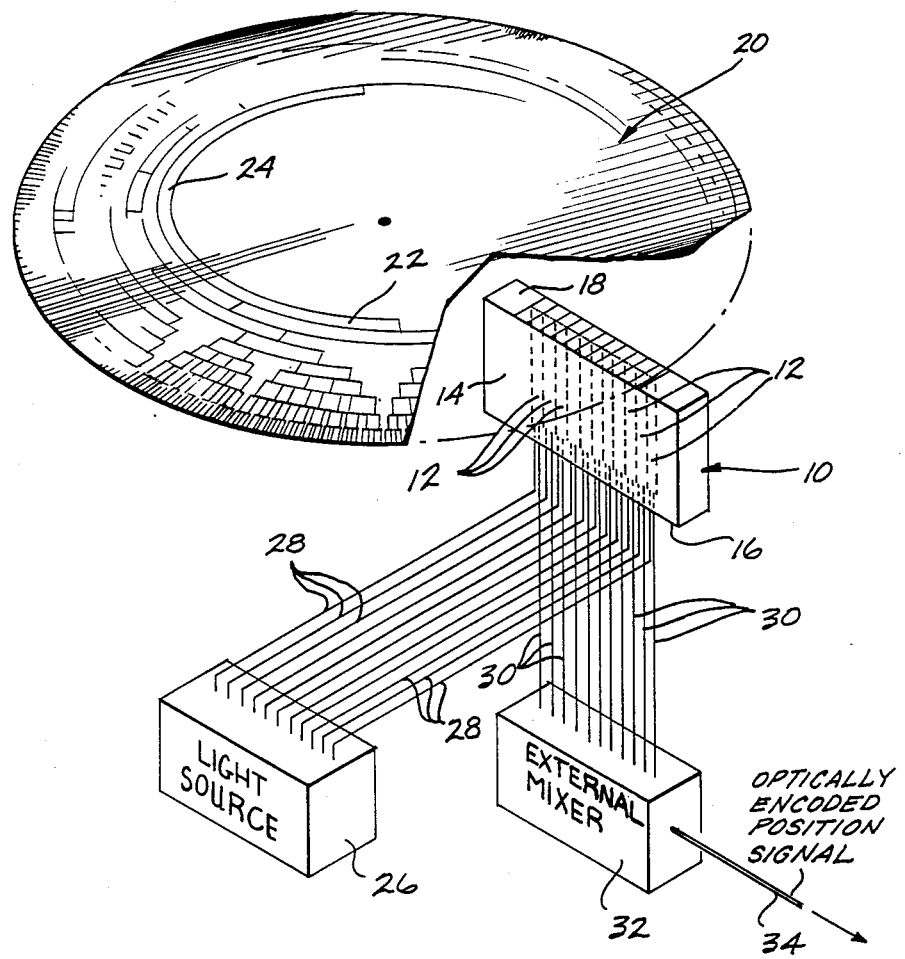
FIG. 1 is a diagrammatic, perspective view of an optical encoding arrangement that utilizes one embodiment of a readhead constructed in accordance with the invention.

Shown in FIG. 1, is an optical readhead (generally indicated by reference numeral 10) which is configured in accordance with the invention and is illustrated in a typical optical rotary encoder environment. As is indicated by dashed lines in FIG. 1, optical readhead 10 includes a plurality of spaced apart optical transmission channels 12 that are formed in the interior of a glass substrate 14 (buried or embedded in the substrate). These optical transmission channels extend from a first edge 16 of the glass substrate to an oppositely disposed edge 18. As also is indicated in FIG. 1, edge 18 of optical readhead 10 is mounted in spaced-apart juxtaposition with an optical encoder disk 20. As shall be described in more detail relative to FIGS. 3 and 4, the end of each optical transmission channel 12 that is located at edge 18 of optical readhead 10 includes a plurality of spaced-apart optical waveguides (not shown in FIG. 1) which launches pulses of light energy for impingement on the surface of optical encoder disk 20 and, in addition, receive light energy that may be reflected from the illuminated portion of optical encoder disk 20. Typically, optical readhead 10 is mounted within a housing unit (also not shown in FIG. 1).

Figure 2:
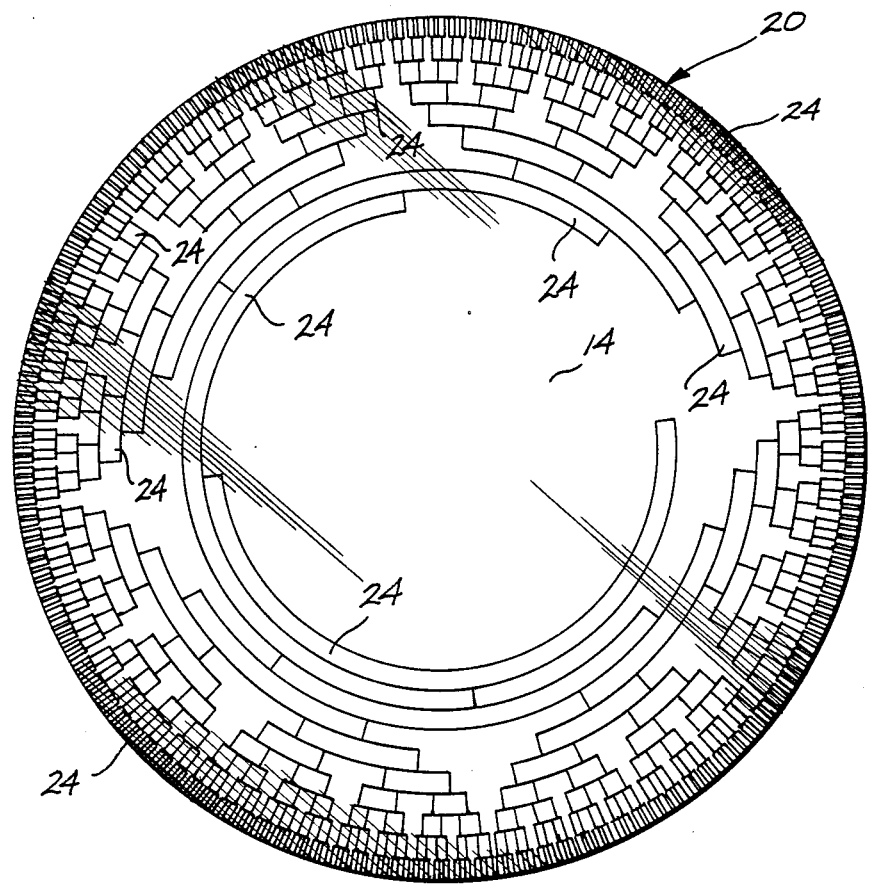
FIG. 2 is a plan view of an optical encoder disk suitable for use in the practice of the invention.

As is indicated in FIG. 1 and as is depicted more clearly in FIG. 2, the surface of optical encoder disk 20 that faces edge 18 of optical readhead 10 includes a plurality of concentric, circumferentially extending encoder bands 22 (ten encoder bands are depicted in FIG. 2). Each encoder band 22 is divided into interspersed, highly reflective and highly transmissive equal angular radial segments that are configured and arranged for generation of a binary encoded optical signal that is representative of the angular position of the optical encoder disk. More specifically, optical encoder disk 20 is formed from a sheet of optical quality glass having a plurality of reflective band regions 24 deposited or otherwise formed on one surface thereof. As is best seen in FIG. 2, the two innermost encoder bands 22 each include a single reflective band region 24 that is subtended by an angle of $\pi$ radians (180°), with the innermost reflective band region 24 overlapping the outwardly adjacent reflective band region 24 by $\pi/2$ radians (90°). Thus, the two innermost bands 22 of the depicted optical disk 20 are equally divided into one highly reflective circumferentially extending band region and one highly transmissive circumferentially extending band region. Progressing outwardly from the second encoder band in a radial direction, the number of highly reflective band regions included in the circumferentially extending bands 22 increases by a factor of two. That is, each of the eight encoder bands 22 that lies outwardly of the two innermost band 22 include twice as many reflective band regions 24 as the adjacent inward neighboring band. Thus, the number of reflective band regions 24 (and the number of interspersed transmissive segments or band regions) in the circumferential bands 22 sequentially increases from the centermost to outermost band in accordance with the sequence 2, 4, 8, . . ., 256 (i.e., $2^{i-2}$; i=3, 4, . . ., N), where i identifies the encoder band (as counted from the center of encoder disk 20 and N is the total number of encoder bands (N=10 in FIG. 2). Further, the angles subtended by the reflective band regions 24 decrease from the two centermost bands (each $\pi$ radians) to outermost band in accordance with the sequence $\pi/2$, $\pi/4$, $\pi/8$, . . ., $\pi/256$ radians (i.e., $\pi/2^{i-2}$ radians, where i=3, 4, . . ., N−1). In addition, in the arrangement of FIGS. 1 and 2, each end of a reflective band region 24 is located at the midpoint of a reflective band region 24 of the next most outwardly located band 22.

It will be recognized by those skilled in the art that the above-described configuration of the depicted encoder disk 20 facilitates generation of a 10-bit binary encoded signal that is representative of angular position of encoder disk 20, with resolution equal to $\pi/256$ (approximately 0.7°). More specifically, when the reflective band regions segments 24 and the interspersed transmissive band regions of encoder bands 22 are considered to correspond to a binary "0" and a binary "1", determining the sequence of reflective and nonreflective band regions along an outwardly extending radial reference line will provide a 10-bit binary sequence (Gray Code) that uniquely identifies the angular position of optical disk 20 (with a resolution $\pi/256$). Further, it will be recognized by those skilled in the art, that the pattern of reflective and transmissive band regions can be varied from that depicted in FIGS. 1 and 2 to implement various binary coding schemes.

With specific reference to FIG. 1, in the practice of the invention, optical readhead 10 is positioned along a selected radial path and is closely adjacent optical encoder disk 20 so that edge 18 is substantially parallel to the surface of the encoder disk. This orientation causes the end regions of the optical transmission channels 12 to be substantially perpendicular to the surface of optical encoder disk 20 with the spacing between the optical transmission channels 12 being established to align a single optical transmission channel 12 with each encoder band 22 of optical disk 20. Light launched from the optical transmission channels 12 (i.e., the ends of the previously mentioned arrays of optical waveguides) impinges on the surface of optical encoder disk 20. When a transmissive band region occupies a segment of the encoder band 22 upon which the light impinges, little or no reflection occurs. On the other hand, when a reflective band region 24 is positioned adjacent an optical transmission channel 12, light is reflected from the optical encoder disk and the reflected light is received by the optical transmission channel 12 that launched the light toward the encoder disk 20.

In the arrangement shown in FIG. 1, pulses of light are provided to the depicted ten optical transmission channels by a light source 26 (e.g., a laser, a light-emitting diode, or another conventional optical source) via ten optical fibers 28 which are individually connected to the ten optical transmission channels 12. In some system designs, pulses of light that include a band of various wavelengths (light of different colors) may be simultaneously supplied to each optical fiber 28, with the refractive index and dimensions of each optical transmission channel 12 being selected so that only a sub-band of the included wavelengths (e.g., a single color) propagates along each optical transmission path 12. In other system designs, pulses of light may be sequentially directed to the optical fibers 28 for transmission one at a time through the optical transmission channels 12 (time-division multiplexing).

Regardless of the temporal relationship between the pulses of light that are supplied to optical transmission channels 12 by light source 26, reflected light that is received by the optical transmission channels 12 propagates to edge 16 of optical readhead 10 and passes into ten optical fibers 30 that interconnect the optical transmission channels 12 with an external light mixer 32 (e.g., a star coupler). External light mixer 32 combines the light energy provided by the optical transmission channels 12 to supply an optically encoded position signal to an optical fiber 34. The optically encoded position signal that propagates along optical fiber 34 is coupled to conventional optical processing equipment (not shown in FIG. 1) which decodes the position signal. For example, in a timedivision multiplexed system in which pulses of light are sequentially supplied to optical transmission channels 12 via optical fibers 28, the signal supplied by optical fiber 34 can be decoded by various conventional demultiplexers. In systems in which light source 26 simultaneously supplies pulses of light to each optical transmission path 12 (via optical fibers 28) and each optical transmission path 12 is dimensioned and arranged for transmission of a specific range of wavelengths, the signal supplied by optical fiber 34 can be demultiplexed by means of a diffraction grating or other conventional apparatus.

Figure 3:
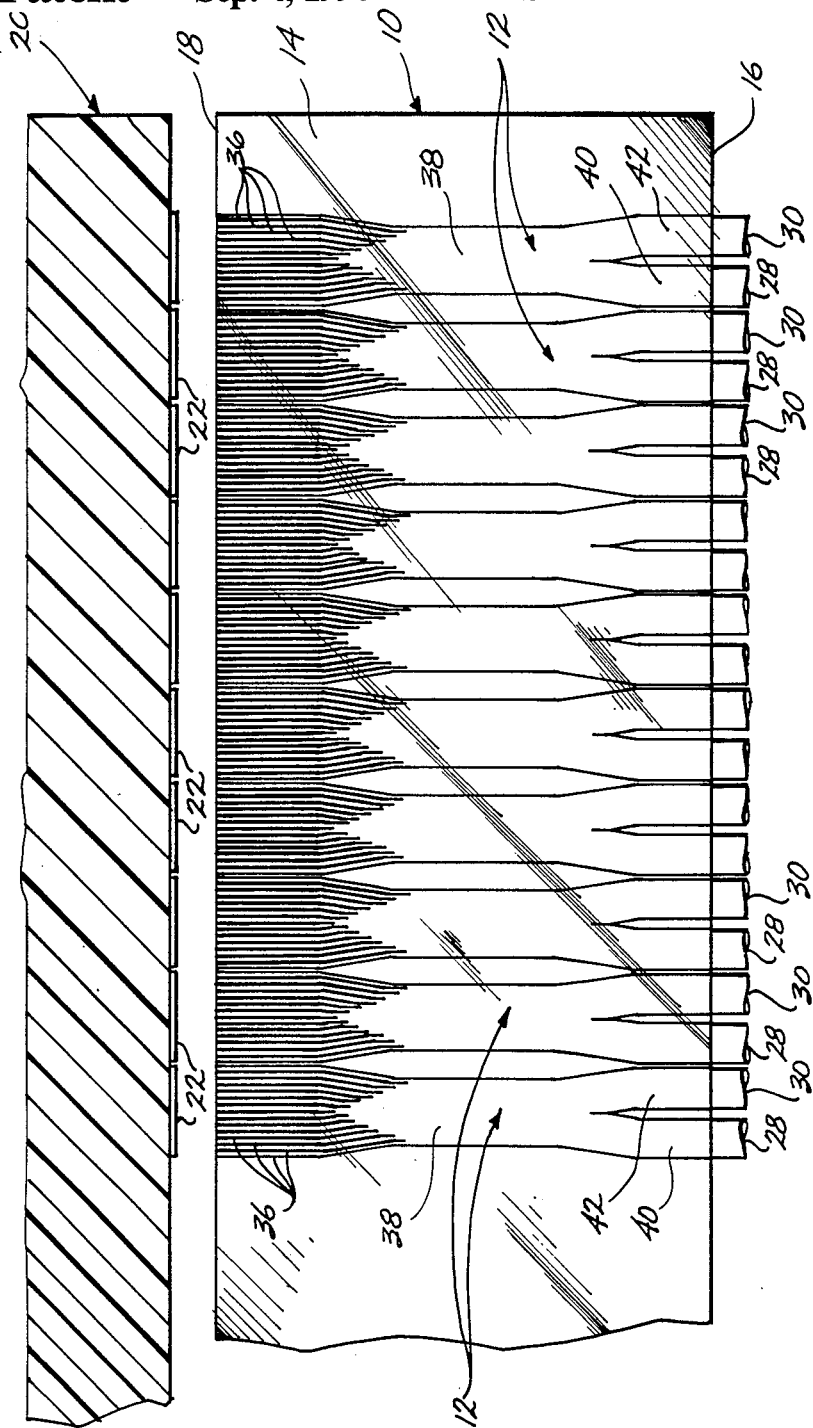
FIG. 3 is a partial plan view of the optical readhead shown in FIG. 1 which illustrates a plurality of optical transmission channels embedded in the glass substrate of the optical readhead.
Figure 4:
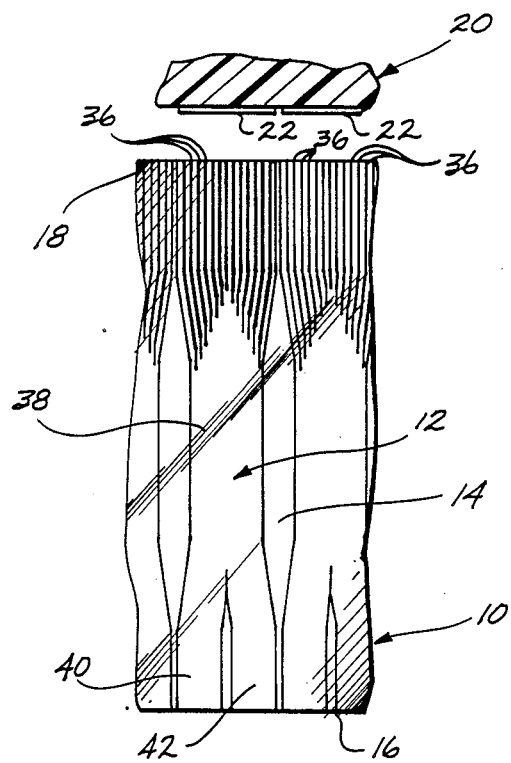
FIG. 4 is a plan view of a portion of the glass substrate that contains a single optical transmission channel of the type shown in FIG. 3.

As is shown in FIGS. 3 and 4, readhead 10 of FIG. 1 includes ten identical optical transmission channels 12 (one for each encoder band 22 of optical encoder disk 20), which extend parallel to one another between first edge 16 and second edge 18 of glass substrate 14. In the depicted embodiment, and array of 14 small optical waveguides 36 is formed in the end region of each optical transmission channel 12 that faces optical encoder disk 20 (i.e., the end of each optical transmission channel 12 that terminates in edge 18 of substrate 14). The linear array of optical waveguides 36 is advantageous in that the optical waveguides 36 collimate the light launched by each optical transmission channel 12 toward optical encoder disk 20. In this regard, when light is launched toward disk 20, each optical waveguide 36 acts as a small source of light with the optical waveguides 36 of each optical transmission channel 12 forming a well-defined light source which directs substantially all of the launched light directly toward the associated band 22 of optical encoder 20. Further, in the practice of the invention, the ion diffusion process that is utilized to form optical waveguides 36 (and the remaining portions of optical transmission channels 12) is established so as control of the ratio of the refractive indices between the core and buffer regions of optical waveguides 36 in a manner that minimizes the angle at which light exits each optical waveguide (and, hence, each optical transmission channel 12). Because of reciprocity between the manner in which optical waveguides 36 launch (or emit) light and the manner in which incident, reflected light is received, the arrayed small optical waveguides 36 also limit the reception of light that is reflected from reflective band regions 24 of optical encoder 20 to light that is reflected from the associated encoder band 22 of optical encoder disk 20. This means that there is little or no cross-coupling of optical signals between adjacent optical transmission channels 12 and optical encoder bands 22 (i.e., crosstalk is minimized).

By way of example, in one embodiment of the invention, each optical waveguide 36 is approximately 25 microns in width (approximately 0.001 inch), with the optical waveguides 36 being spaced apart by approximately three microns. Thus, the end region of each optical transmission path 12 that faces optical decoder disk 20 is approximately 454 microns wide (approximately 0.018 inch). In this embodiment, an optical disk 20 having a diameter of approximately two centimeters (approximately 0.8 inch) is employed, with the width of each optical encoder band 22 substantially corresponding to the width dimension of the arrayed optical waveguides 36 (approximately 454 microns; 0.018 inch).

Located in the central region of each optical transmission channel 12 is a mixer section 38. As is indicated by both FIGS. 3 and 4, mixer section 38 basically is a planar optical waveguide having a width dimension that is smaller than the overall width of the arrayed optical waveguides 36 with the axial center line of mixer section 38 being substantially parallel to the outward end regions of each optical waveguide 36 (i.e., substantially perpendicular to edges 16 and 18 of glass substrate 14). To provide low loss operation and uniform coupling of light between mixer section 38 and optical waveguides 36, a transition region is formed in which optical waveguides 36 remain substantially parallel to one another and smoothly merge with mixer section 38.

Located at the end of each mixer section 38 of an optical transmission channel 12 are input and output optical waveguides 40 and 42, respectively. More specifically, the region of each optical transmission channel 12 that is located nearest most edge 16 of glass substrate 14, in effect forms a Y-type junction for coupling optical energy into and out of mixer section 38. As is indicated in FIG. 3, each input optical waveguide 40 is joined to an associated optical fiber 28 (which supplied pulses of light to readhead 10) and each output optical waveguide 42 is joined to an associated optical fiber 30 (which couples reflected light from the associated optical transmission channel to apparatus that is employed with readhead 10 (e.g., external mixer 32 of the arrangement shown in FIG. 1).

As is known to those skilled in the art, various methods and techniques can be employed for joining optical fibers 28 and 30 to input and output waveguides 40 and 42 of readhead 10. For example, in some arrangements it may be advantageous to employ a fiber micropositioner and butt-coupler arrangement. In other situations V-grooves can be etched or otherwise formed in the surface of glass substrate 14 so as to extend downwardly into input and output waveguides 40 and 42 with optical fibers 28 and 30 being installed in the V-grooves in optical communication with the associated input and output optical waveguides.

In view of the above-described arrangement of the disclosed embodiment, it can be recognized that each optical transmission channel 12 functions in the same manner as a 2×14 star coupler in which the 14 optical transmission paths formed by optical waveguides 36 launch light toward and receive light from optical encoder disk 20. In addition, the two optical transmission paths located along edge 16 of glass substrate 14 (input optical waveguide 40 and output optical waveguide 42) couple optical energy to the arrayed 14 optical waveguides 36 and couple energy from readhead 10 that is reflected from optical disk 20 and received by the 14 arrayed optical waveguides 36. It will be noted, that since input and output optical waveguides 40 and 42 in effect form a Y-junction, substantially one-half of the energy reflected from a reflective band region 24 of optical encoder disk 20 propagates along input waveguide 40 and the remaining one half of the optical energy propagates along output waveguide 42.

To provide uniform distribution of optical energy to the optical waveguides 36 and thorough mixing of reflected energy supplied by optical waveguides 36 to mixer section 38, the length of mixer section 38 is established so that numerous internal reflections of optical energy occur as light propagates along mixer section 38. In this regard, in the previously mentioned realization of the depicted embodiment in which the width of each optical waveguide 36 is 25 microns, optical mixer section 38 is approximately 250 microns in width and at least 250 microns in length. In this realization, the width of each input and output optical waveguide 40 and 42 is approximately 250 microns.

Figure 5:
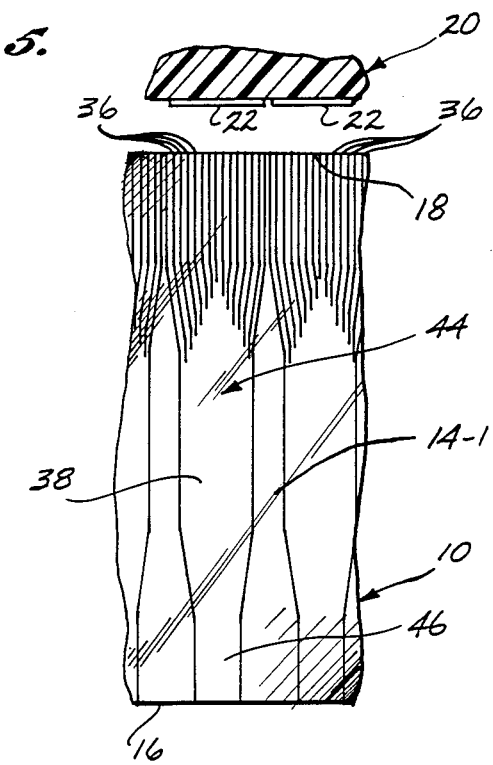
FIG. 5 is a plan view of a second type of optical transmission channel that can be utilized in the practice of the invention.

In some situations it may be advantageous to utilize a set of optical transmission channels to supply light to the optical encoder disk 20 and a separate set of optical transmission channels to receive light reflected from optical encoder disk 20, thereby eliminating the above-mentioned loss of one-half the reflected light energy (i.e., reflected light energy that propagates along input waveguide 40 of the above-described optical transmission channels 12). In such situations, optical transmission channels 44 of the type shown in FIG. 5 can be employed. As can be seen in FIG. 5, each optical transmission channel 44 includes the previously described array of optical waveguides 36 and a mixer section 38. Located along edge 16 of the glass substrate 14 is a single optical waveguide 46, which is tapered to smoothly merge with mixer section 38. Thus, it can be recognized that the primary difference between optical transmission channels 12 and 44 is that each optical transmission channel 12 utilizes Y-connected input and output waveguides (40 and 42), whereas each optical transmission channel 44 utilizes a single waveguide which couples light into optical transmission channel 44 (input waveguide) or couples light from optical transmission channel 44 that was reflected from an associated encoder band 22 of optical encoder disk 20 (output waveguide).

Figure 6:
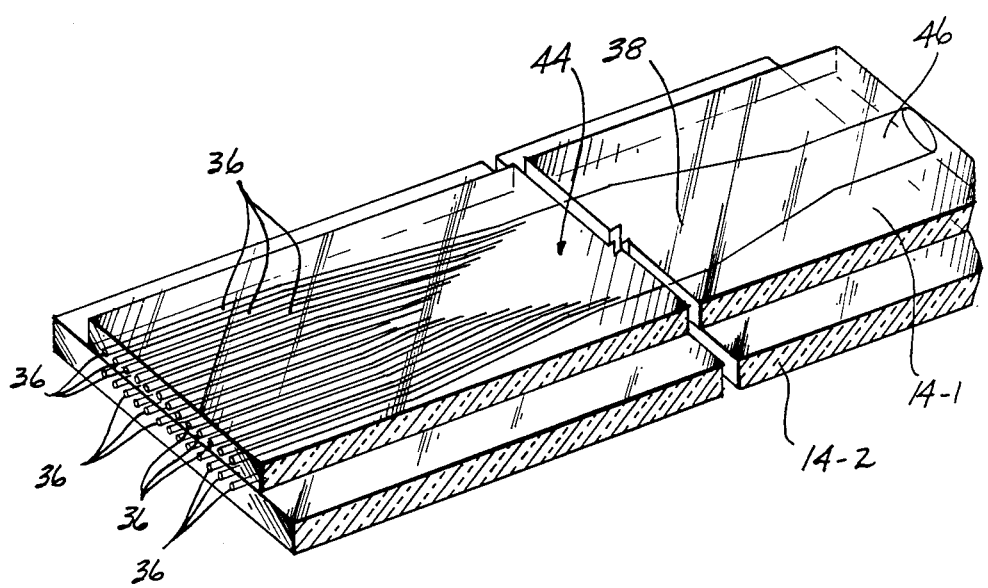
FIG. 6 is a partial perspective view of a readhead that is embodied with the optical transmission channels of FIG. 5.

As is indicated in FIG. 6, in embodiments of the invention that utilize optical transmission channels 44, the glass substrates (14-1 and 14-2) that include the optical transmission channels 44 are bonded or fused to one another so that the optical transmission channels are aligned with one another. In most embodiments, the optical transmission channels 44 lie relatively close to one planar surface of the glass substrate (14-1, 14-2). Under such circumstances, it generally is advantageous to position the substrates so that the distance between the aligned optical transmission channels 44 is minimized. This positioning is useful in ensuring that light that is directed to the optical encoder 20 by one of the aligned optical transmission channels 44 is reflected to and gathered by the other aligned optical transmission channel 44. To further ensure minimized loss of light energy, the aligned optical transmission channels 44 can be oriented so that the optical transmission channel that receives reflected light energy lies along the angle of reflectance that results from positioning of the optical transmission channel 44 that supplies light to the optical encoder.

Regardless of the exact orientation of the glass substrates 14-1 and 14-2 and the positioning of the optical transmission channels 44 within the glass substrates, the optical fibers that supply light to the readhead (e.g., optical fibers 28 of FIG. 1) are coupled to the optical transmission channels 44 of one substrate (e.g., substrate 14-1 of FIG. 5 and the optical fibers that carry light reflected from the optical encoder disk 20 (e.g., optical fibers 30 of FIG. 1) are coupled to the optical transmission channels 44 of the second substrate (e.g., substrate 14-2 of FIG. 5).

As was previously mentioned, the optical transmission channels (12 and 44) are integrally formed in readhead 10 by ion diffusion techniques in which dopant ions are exchanged with alkaline earth ions of the glass (sodium or potassium ions) to form specifically configured regions that exhibit a higher refractive index than the glass substrate. In the currently preferred embodiments of the invention, electric field assisted diffusion is utilized to not only form the desired optical transmission channels 12, but also to bury the optical transmission channels in glass substrate 14 so that little or no surface scattering occurs as optical energy propagates along each optical transmission channel 12.

One technique that can be utilized in forming optical transmission channels 12 and 44 utilizes a sodium aluminosilicate glass substrate and diffusion of silver ions and is described, for example, by K. Forrest, et al, in a technical article, entitled "Channel Waveguides in Glass via Silver-Sodium Field-Assisted Ion Exchange", which was published in the *Journal of Lightwave Technology*, Vol. LT 4., No. 2, Feb., 1986. In the process disclosed by Forrest, et al, a sodium aluminosilicate glass substrate such as Corning Glass Company Product Code 0317 is processed with conventional microphotolithography to mask the upper surface of the substrate in a manner that allows electron beam deposition of a thin silver film that corresponds to the pattern of the optical transmission paths to be formed during the diffusion process (e.g., the arrayed optical waveguides 36, mixer sections 38, and input and output optical waveguides 40 and 42 of readhead 10). This operation in effect forms an aperture pattern, which serves as the anode during the field-assisted ion exchange process. To form the cathode, the opposite substrate surface is coated with a conductive material such as a film of copper, which can be deposited by thermal vacuum deposition or other conventional techniques.

The suitably prepared substrate, which can include a number of readheads 10, is then supported in a conventional vacuum-evaporated unit with the masked side of the substrate facing downwardly and being supported over a resistively heated source of silver vapor. A direct current electric field is established in the glass substrate by interconnecting the anode aperture pattern to the positive electrode of a conventional dc power supply and interconnecting the metallic film that forms the cathode of the substrate to the negative electrode of the power supply. In addition, the substrate is heated by a conventional source such as a tungsten filament lamp that is mounted above the supported substrate.

To form the optical transmission channels (12 or 44), the substrate is heated to a desired temperature and an appropriate electric field is established. More specifically, both the temperature of the substrate and the applied electric field cause the formation of silver ions and migration of the ions inwardly into the substrate. Thus, the strength of the electric field, the temperature of the substrate and diffusion time can be established and controlled to yield desired two dimensional (cross-sectional) refractive index profiles in each optical transmissional channel 12 that is being formed. In this regard, although the temperature of the substrate is limited only by the substrate strain point (typically in excess of 500° C.) temperatures within the range of 150° C. and 300° C. are commonly employed with the applied electric field usually being between 120 V/mm and 240 V/mm. With regard to refractive index profile, stepindex profiles are obtained when the substrate temperature is maintained within the range 150°-200° C., with the electric field strength having little effect on profile steepness. Multimode graded index profiles are obtained at higher substrate temperatures (e.g. 300° C.). Since the field strength at which substrate dielectric breakdown occurs is directly related to temperature, the field strength utilized in the diffusion process for obtaining graded index profiles typically is limited to no more than 120 V/mm.

Once the optical transmission channels (12 or 44) have been formed in the surface of the substrate 14 by a process such as that generally disclosed by Forrest et al., the optical transmission channels are buried in the substrate 14 by a second diffusion step in which the heated substrate is subjected to an electric field with the environment that surrounds the substrate being devoid of silver ions or other dopant materials that potentially could alter the refractive characteristics of the substrate and optical transmission channels. For example, after removal of the silver aperture (anode), the substrate can be immersed in a molten salts bath having a composition that is matched to the glass substrate so that no further exchange of ions occurs. With a suitable electric field applied and the substrate maintained at a relatively constant temperature, the silver ions diffuse further into the substrate thereby burying or embedding the optical transmission channels beneath the surface of the substrate and, further, resulting in a relatively symmetrical cross-sectional area over which there is relatively minor skewing of the refraction index profile.

Although the currently preferred process for realizing the invention utilizes the above-described field-assisted diffusion of silver ions in sodium aluminosilicate glass substrates, those skilled in the art will recognize that other ion exchange processes may be employed. For example, various buried optical waveguide configurations have been realized in the art, utilizing both soda-lime-silicate glass substrates and borosilicate glass substrates. The substrates being immersed in ionic salt baths containing desired dopant ions such as potassium, silver, lithium or thallium. Generally, in order to achieve optical waveguide dimensions on the order of those utilized in the disclosed embodiment of the invention, the salt bath immersion diffusion process is assisted by an applied electrical field, and, in addition, a second diffusion process is carried out with the substrate immersed in a salt bath that is compositionally matched to the substrate glass to bury the waveguide structure in the substrate.

The embodiments of the invention in which an exclusive property or privilege is claimed are defined as follows:

1. A readhead for an optical encoder comprising:
   at least one glass substrate; and
   a plurality of ion diffused optical transmission channels formed in the interior region of each said glass substrate, said optical transmission channels incuding a plurality of spaced apart optical waveguides for supplying light to a predetermined region of said optical encoder and for receiving light that is reflected from said predetermined region of said optical encoder, said optical transmission channels also including at least one optical waveguide for supplying light to said optical transmission channel and for outputting light from said optical transmission channel;
   each said optical transmission channel further including an optical mixer section located intermediate to said plurality of optical waveguides and said at least one optical waveguide with said optical mixer section being in optical communication with both said plurality of optical waveguides and said at least one optical waveguide.

2. The readhead of claim 1 including a single glass substrate, said glass substrate being of planar geometry and including first and second oppositely disposed edges; said plurality of optical transmission channels being substantially parallel to one another and extending between said first and second edges of said glass substrate with each waveguide of said plurality of waveguides that is included in each optical transmission channel terminating at and being substantially perpendicular to said second edge of said substrate.

3. The readhead of claim 2, wherein each of said optical transmission channels include an input optical waveguide and an output optical waveguide extending between said first edge of said substrate and said optical mixer section, said output optical waveguide and said input optical waveguide for respectively outputting light from and supplying light to said optical transmission channel; and wherein said input optical waveguide and said output optical waveguide merge with one another to form a Y-type junction at one boundary of said optical mixer section.

4. The readhead of claim 3, wherein said planar glass substrate is formed of sodium aluminosilicate glass and said optical transmission channels are formed in said substrate by replacement of sodium ions with silver ions.

5. The readhead of claim 4, wherein each of said plurality of waveguides, each said mixer section and each said input and output waveguide exhibit a graded cross-sectional refractive index profile.

6. The readhead of claim 5, wherein each said optical transmission channel is formed by electric field assisted ion diffusion.

7. The readhead of claim 1 including two planar glass substrates said substrates being positioned adjacent one another with one surface of the first planar glass substrate being in juxtaposition with one surface of the second planar glass substrate, each of said two planar glass substrates having first and second edges and an equal number of said optical transmission channels that extend between said first and second edges, said optical transmission channels of said first planar glass substrate for supplying light to predetermined regions of said optical encoder and said optical transmission channels of said second planar glass substrate for receiving light reflected from said predetermined regions of said optical encoder, each said optical transmission channel of said first substrate being located adjacent an optical transmission channel of said second substrate each said optical transmission channel of said first and second planar glass substrates including a single optical waveguide extending between said mixer section of said optical transmission channel and said first edge of the planar glass substrate that includes said optical transmission channel.

8. The readhead of claim 7, wherein said of said two planar glass substrates are formed of sodium aluminosilicate glass and said optical transmission channels are formed in said substrates by replacement of sodium ions with silver ions.

9. The readhead of claim 8, wherein each of said plurality of waveguides, each said mixer section and each said optical waveguide exhibit a graded cross-sectional refractive index profile.

10. The readhead of claim 9, wherein each said optical transmission channel is formed by electric field assisted ion diffusion.

* * * * *